United States Patent [19]
Schneider

[11] Patent Number: 6,108,256
[45] Date of Patent: Aug. 22, 2000

[54] NFET/PFET RAM PRECHARGE CIRCUITRY TO MINIMIZE READ SENSE AMP OPERATIONAL RANGE

[75] Inventor: Thomas R. Schneider, Anaheim Hills, Calif.

[73] Assignee: Adaptec, Inc., Milpitas, Calif.

[21] Appl. No.: 09/395,922

[22] Filed: Sep. 14, 1999

[51] Int. Cl.[7] .................................................. G11C 7/00
[52] U.S. Cl. ........................ 365/203; 365/207; 365/154
[58] Field of Search .................................. 365/203, 207, 365/154, 156

[56] References Cited

U.S. PATENT DOCUMENTS 5,604,704  2/1997  Atsumo ................................ 365/203

*Primary Examiner*—Huan Hoang
*Attorney, Agent, or Firm*—Martine Penilla & Kim, LLP

[57] ABSTRACT

The present invention provides a precharge circuit for precharging bit lines coupled to a read sense amplifier and a RAM cell. The precharge circuit includes a set of precharge transistors, a first transistor, and a transistor pair. The set of precharge transistors is coupled to said bit lines for precharging said bit lines with one precharge transistor per bit line. The first transistor is coupled to turn on said set of precharge transistors when said RAM cell is not being read. The first transistor is operative to reduce the gate-to-source voltage $V_{GS}$ of said set of precharge transistors such that each of said precharge transistors output a reduced precharge voltage to the associated bit line. The transistor pair is coupled to said set of precharge transistors and is operative to switch said precharge transistors for reading said RAM cell. In this configuration, the RAM cell outputs a differential signal onto said bit lines when said precharge transistors are turned off. The read sense amplifier monitors said bit lines to detect said differential signal on said bit lines as a data bit.

32 Claims, 3 Drawing Sheets

NFET/PFET RAM PRECHARGE CIRCUITRY TO MINIMIZE READ SENSE AMP OPERATIONAL RANGE

BACKGROUND OF THE INVENTION

1. Field of the Invention

The present invention is directed to an improved RAM cell precharge circuit and, more particularly, to an NFET/PFET precharge circuit which minimizes the RAM cell operational voltage range.

2. Description of the Related Art

The past few years have seen a dramatic increase in the speed and power of personal computing systems. Indeed, since general acceptance of personal computer systems in the 1960's, the speed and power of such systems have grown with an almost power law dependence.

Random-Access-Memory (RAM) design is a particular enabling technology for modem day high-speed computer systems and, in the computer industry, has given rise to larger and larger memory capacities allowing larger and more complex application programs to be hosted on desktop or laptop computer systems. However, with the increase in memory capacity on a single chip, with multiple gigabit memories being common, valuable silicon real estate must be conserved from encroachment by support circuitry such as read sense amplifiers.

Specifically, most conventional SRAM circuit designs incorporate 2 bit lines per bit to read the stored digital value from an SRAM storage cell. Using 2-bit lines is done so that the read circuitry which evaluates the state of the storage cell can be implemented using differential sensing techniques such that the read access times of the SRAM can be minimized. When implementing an SRAM read sense amp using differential bit lines, a circuit designer must take into account the voltage range to which the bit lines will charge up to. The smaller the voltage range, the easier it becomes to design and construct a high performance, efficient differential bit line sense amplifier.

A typical prior art-type SRAM storage cell, sense amp, and precharge circuitry is depicted in semi-schematic block diagram form in FIG. 1. Basically, a RAM storage cell 10 is configured to output its pre-programmed state on differential bit lines 12 and 14 which are precharged by pre-charge NFET transistors 16 and 18, coupled between a voltage supply and the bit lines 12 and 14, respectively. The RAM cell 10 outputs its pre-programmed state differentially, by outputting the digital state value Q and its logical inverse $\overline{Q}$ onto the bit lines. This differential signal is read by a sense amp 20 which outputs either a logical ONE or ZERO in response to the "sense" of the differential signal.

During a precharge cycle, the NFET precharge transistor 16 and 18 are driven by a buffer 22, traditionally a large PFET/NFET inverter circuit, in response to an active-low $\overline{\text{PRECHG}}$ signal issued by peripheral SRAM circuitry. In conventional fashion, the 2-bit lines 12 and 14 are precharged by the pre-charge NFETs to a value of about the supply voltage minus the threshold voltage of the NFET, $V_{DD}-V_{TN}$, after the pre-charge transistors are turned on and the transistor response has time to settle. After the precharge cycle is complete, the SRAM storage element 10 is allowed to drive the bit lines. One of the bit lines will be driven to a logical high (a relatively simple condition since each bit line is already charged) while the other will be driven to a logical low. As the bit lines start diverging in their respective voltage values, the sense amp 20 "senses" the difference between the voltage values on the bit lines and drives its output either high or low depending on the "sense" of the difference.

For high speed response, the design of this differential sense amplifier needs to be optimized as a function of particular differential voltage ranges. For example, the optimum circuit implementation of a differential sense amplifier operating at an initial bit line precharge voltage of approximately 2.6 volts would be quite different from the optimum circuit design of a differential sense amplifier that was optimized for an initial bit line voltage of about 2 volts. If the design were required to account for this difference in initial operational voltages of the bit lines, the design would be far less efficient due to the need to either sacrifice speed and/or operate at a higher power level to accommodate the greater voltage swing.

The source of voltage swing irregularities will become apparent when considering well known time response characteristic curves depicted in FIG. 2. In well understood fashion, when the NFET pre-charge transistors 16 and 18 are turned on by an appropriate voltage signal from the buffer 22, the bit lines 12 and 14 initially charge to an intermediate voltage level very quickly. For example, for a circuit coupled to an approximately 3.3 volt supply, the NFET pre-charge transistor 16 and 18 will rapidly charge the bit lines 12 and 14 to a value of approximately 2.0 volts. The initial voltage response is rapid and substantially linear up to the about 2.0 volt level, at which time the voltage response rolls-off and increases more slowly. This slow increase in bit line voltage continues until the bit lines 12 and 14 are fully pre-charged to a final level approximately equal to the supply voltage minus the threshold voltage of the NFET, $V_{TN}$. In the illustration of FIG. 2, the first characteristic curve represents a turn-on signal applied to an exemplary pre-charge transistor. The second characteristic curve represents the high-to-low and low-to-high response characteristics of a typical transistor, and graphically depicts the finite time required to achieve $V_{out}=V_{DD}-V_{TN}$.

While inconvenient, the major difficulty with finite response occurs during burst reads of the RAM cell 10 where the pre-charge transistors 16 and 18 are being switched on and off at a relatively high rate whose period exceeds the characteristic $T_{LH}$ of the transistors. In these situations, the pre-charge transistors 16 and 18 are not given enough time to pull the bit lines 12 and 14 up to the full supply rail. The time-dependent roll-off portion of their response characteristics are truncated and the transistors are only able to effectively operate in the early-turn-on portions of their operational regimes, causing the bit lines 12 and 14 to pre-charge to levels of only approximately 2.0 volts. This condition will be evident from examination of the third and fourth characteristic curves of FIG. 2, which depict a high-rate turn-on input pulse train and the corresponding output characteristic curves. With a signal rate greater than $T_L$, the output response is truncated to a degree where the maximum output voltage is less than the supply rail by some characteristic value $\Delta V$. Thus, the sense amp 20 must also be configured to operate at initial voltage levels of 2.0 volts, as well as initial voltage levels of 2.6 volts. As can be appreciated, such wide input voltage range of the sense amp 20 thus degrades performance.

Thus, what is needed is precharge circuitry that provides a narrower input voltage range for a read sense amplifier of RAM cells so as to improve performance.

SUMMARY OF THE INVENTION

The present invention fills these needs by providing NFET/PFET RAM precharge circuitry to minimize read sense amp operational range. It should be appreciated that the present invention can be implemented in numerous ways, including as a process, an apparatus, a system, a device, and a method. Several inventive embodiments of the present invention are described below.

In one embodiment, the present invention provides a precharge circuit for precharging bit lines coupled to a read sense amplifier and a RAM cell. The precharge circuit includes a set of precharge transistors, a first transistor, and a transistor pair. The set of precharge transistors is coupled to said bit lines for precharging said bit lines with one precharge transistor per bit line. The first transistor is coupled to turn on said set of precharge transistors when said RAM cell is not being read. The first transistor is operative to reduce the gate-to-source voltage $V_{GS}$ of said set of precharge transistors such that each of said precharge transistors output a reduced precharge voltage to the associated bit line. The transistor pair is coupled to said set of precharge transistors and is operative to switch said precharge transistors for reading said RAM cell. In this configuration, the RAM cell outputs a differential signal onto said bit lines when said precharge transistors are turned off. The read sense amplifier monitors said bit lines to detect said differential signal on said bit lines as a data bit.

In another embodiment, the present invention provides a precharge circuit for precharging a pair of bit lines coupled to a read sense amplifier and RAM cells. The precharge circuit includes a pair of precharge transistors, a first transistor, a transistor pair, and input logic circuitry. The pair of precharge transistors is coupled to said bit lines for precharging said bit lines. The first transistor is coupled to turn on said precharge transistors when said RAM cells are not being read and is operative to reduce the gate-to-source voltage $V_{GS}$ of said set of precharge transistors such that each of said precharge transistors output a reduced precharge voltage to the associated bit line. The transistor pair is coupled to said precharge transistors and is arranged to switch said precharge transistors for reading said RAM cells. The RAM cell outputs a differential signal onto said bit lines when said precharge transistors are turned off. The input logic circuitry coupled to said first transistor and said transistor pair and is arranged to generate a first signal when said RAM cells are not to be read, wherein said input logic circuitry provides said first signal to said first transistor to reduce said precharge voltage at said bit lines.

In yet another embodiment, the present invention provides a precharge circuit for precharging bit lines coupled to a read sense amplifier and a RAM cell. The precharge circuit includes a set of precharging transistors, a first transistor, and a transistor pair. The set of precharge transistors is coupled to said bit lines for precharging said bit lines with one precharge transistor per bit line. The first transistor is coupled to turn on said set of precharge transistors when said RAM cell is not being read. The first transistor is operative to cause each of said precharge transistors to output a reduced precharge voltage to the associated bit line. The transistor pair is coupled said set of precharge transistors and being operative to switch said precharge transistors for reading said RAM cell, which outputs a differential signal onto said bit lines when said precharge transistors are turned off. The reduced precharge voltage on said bit lines serve to reduce the voltage range of said bit lines.

The precharge circuits of the present invention advantageously reduces the operating voltage range of read sense amplifiers. Such reduction in the input voltage range allows a more efficient design of the bit line read sense amplifiers with enhanced performance. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

The present invention, NFET/PFET RAM precharge circuitry to minimize read sense amp operational range, is described. It will be obvious, however, to one skilled in the art, that the present invention may be practiced without some or all of these specific details. In other instances, well known process operations have not been described in detail in order not to unnecessarily obscure the present invention.

Figure 1:
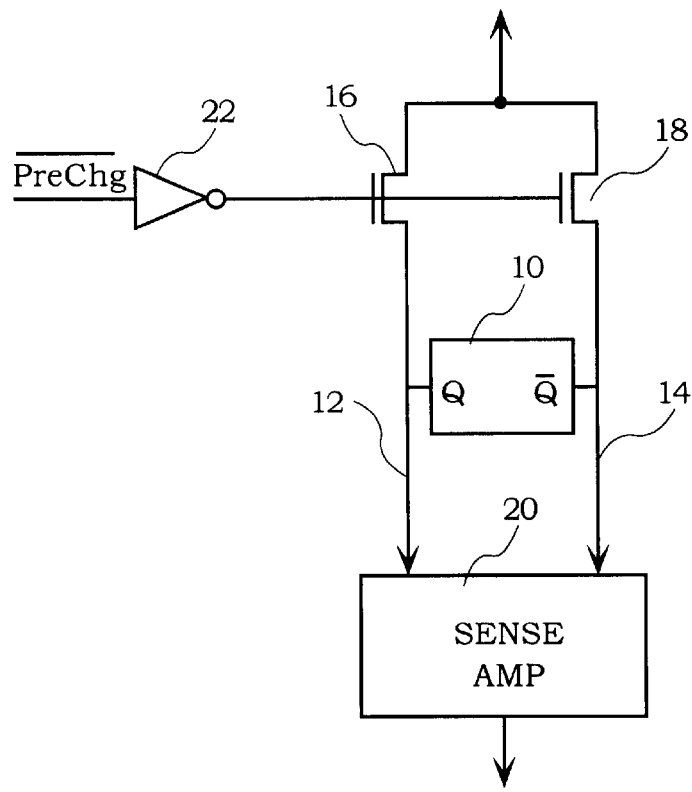
FIG. 1 is a semi-schematic simplified block diagram of a conventional SRAM storage circuit including a differential sense amplifier and conventional precharge circuitry.
Figure 2:
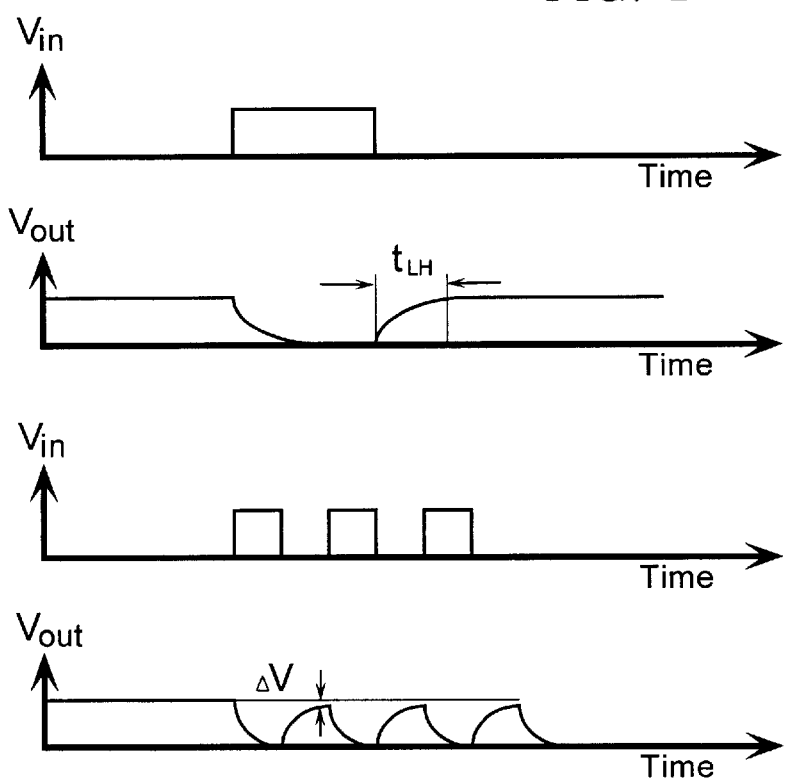
FIG. 2 is a series of characteristic curve of the input and output response characteristics of an N-channel transistor, in the time domain, showing output voltage reduction as a function of input signal rate.
Figure 3:
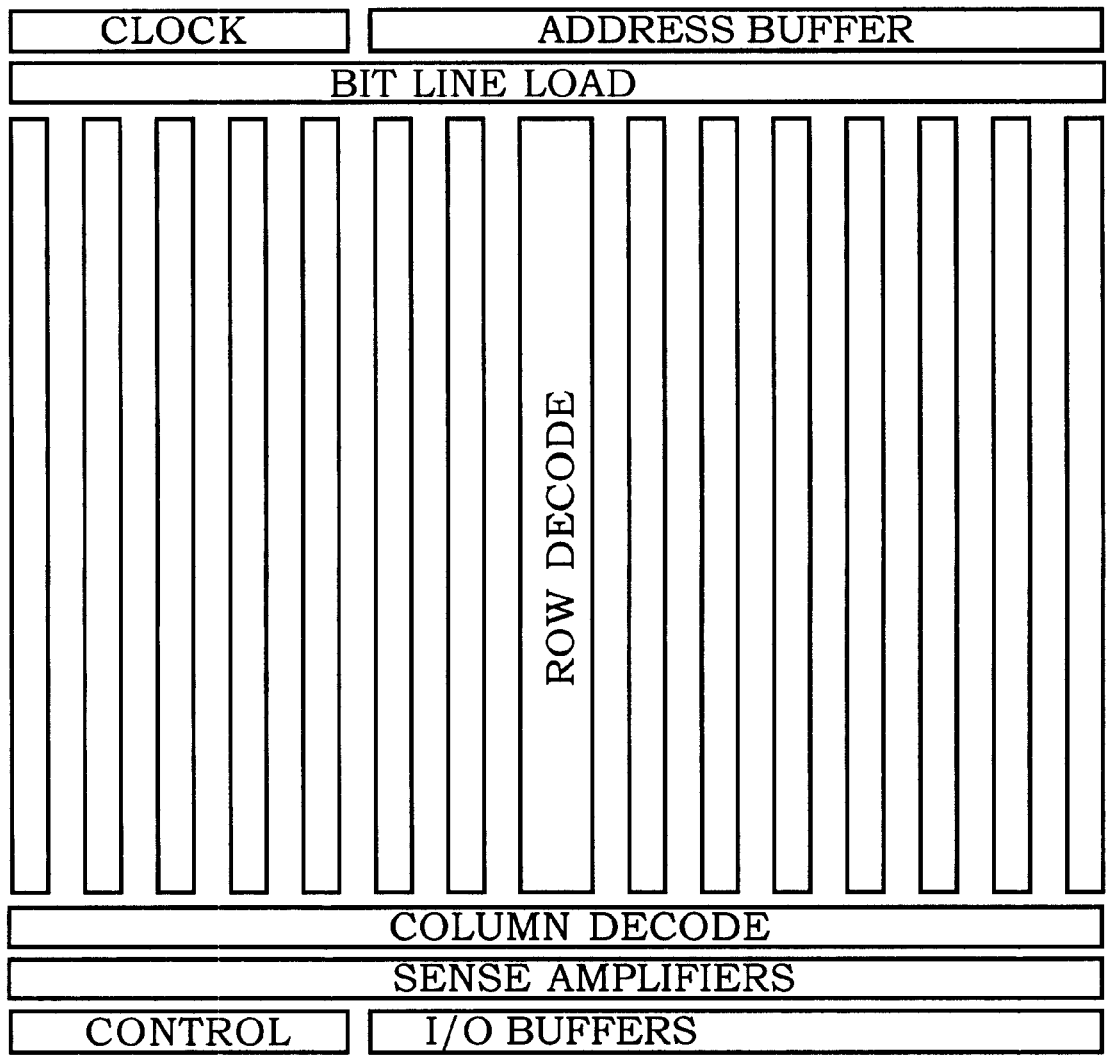
FIG. 3 is a semi-schematic block diagram of the pertinent portions of an SRAM.

FIG. 3 illustrates a block diagram of an exemplary architecture for an SRAM memory circuit of the type adapted for use with the present invention. Conventionally, the SRAM accomplishes practical addressing using cell arrays disposed as blocks. Each location within a block is specified by a column address and a row address. In most architectures, the rows comprise word lines, while columns comprise the bit, or data, lines. Rows are selected by applying an appropriate signal to row decoder circuits, while the data output, or column, is selected by applying an appropriate signal to the column decoder circuitry. Sense amplifiers detect the column (cell) contents which are then provided to I/O buffers for output, with all of the foregoing operating in response to control circuitry.

Figure 4:
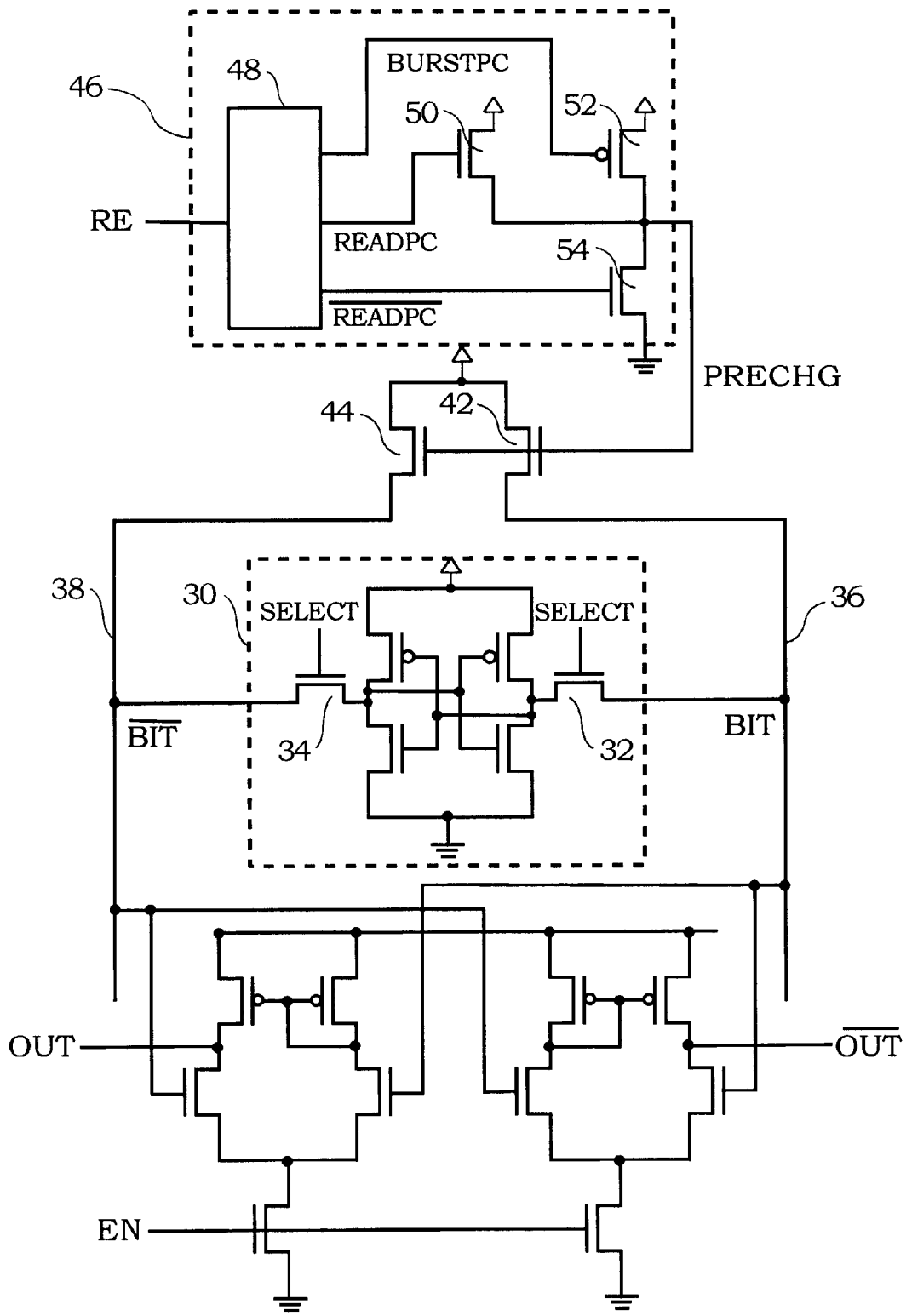
FIG. 4 is a semi-schematic circuit diagram of an SRAM memory cell including a differential sense amp and NFET/PFET precharge circuitry according to the present invention.

A high precision, high speed SRAM circuit including modified pre-charge circuitry is depicted in the semi-schematic circuit diagram of FIG. 4. A conventional CMOS static RAM memory cell, indicated at 30, is constructed using cross-coupled inverters in order to form a bistable latch. Access to the memory cell 30 is obtained through N-channel pass transistors 32 and 34, which are connected to BIT and $\overline{\text{BIT}}$ lines 36 and 38, respectively. The gates of the N-channel pass transistors 32 and 34 are conventionally connected to a SELECT signal line and operates such that when the voltage on the SELECT line is high, data can be written to, or read from, the cell. A condition where the voltage on the SELECT line is equal to ZERO decouples the cell from the data lines and corresponds to a hold state. The bit lines 36 and 38 are therefore used to transfer data in and out of the cell, while the SELECT line controls connectivity of the cell to the data or bit lines. While depicted in the exemplary embodiment of FIG. 4 as a single state signal, SELECT may be provided as a complimentary signal if the memory cell circuit structure so requires.

A data read operation is accomplished by pre-charging the bit lines 36 and 38 and transferring the data from the memory cell 30 to the bit lines. The complimentary BIT and $\overline{\text{BIT}}$ signals are transferred to the bit lines and, thence, to differential sense amplifier circuitry 40 for detection and output.

Many variations of differential sense amplifier design may be utilized in the context of the invention, but in the exemplary embodiment of FIG. 4, the sense amplifier circuitry 40 is illustrated as a simple current-mirror design, suitably including two dynamically switched differential amplifiers with active P-channel current sources. The exemplary embodiment of FIG. 4 is depicted as including two differential amplifiers in order to define complimentary outputs, OUT and $\overline{\text{OUT}}$. If the SRAM were implemented with single ended outputs, only a single differential amplifier coupled to the bit lines would be required. Further, in conventional fashion, the differential amplifiers are configured to define complimentary outputs in response to a read-enable signal, EN, applied to the gate terminals of N-channel sink transistors coupled between each respective differential pair and ground.

The bit lines 36 and 38 are pre-charged by N-channel pre-charged transistors 42 and 44 coupled between $V_{DD}$ and the BIT and $\overline{\text{BIT}}$ lines, respectively. The precharge transistors 42 and 44 are operatively responsive to a pre-charge signal, PRECHG, defined by pre-charge driver circuitry 46 in accordance with the invention.

The pre-charge circuitry 46 is somewhat similar in form to an inverting buffer, in that it comprises a P-channel transistor 52 and an N-channel transistor 54 coupled in parallel fashion between a supply voltage and ground, but their gate terminals are not connected in common and to a common signal source. In addition, the pre-charge circuitry 46 comprises an additional N-channel pull-up transistor 50, connected between the supply voltage and the common drains of the PFET/NFET parallel coupled transistors 52 and 54. The common node between the transistors 50, 52 and 54 of the pre-charge circuit 46 is connected to the gate terminals of the pre-charge transistors 42 and 44 of the memory circuit.

Pre-charge driver circuitry 46 also includes input logic circuitry 48 connected to receive a pre-charge enable signal, Read Enable (RE), from an SRAM's control logic block. The input logic circuitry 48 receives the pre-charge enable signal and resolves the signal into three components, depending on the desired read state of the system, i.e., long latency period reads, or burst reads. For long latency period reads, the input logic circuitry 48 outputs a first signal, denoted READPC, which is provided to the gate terminal of the N-channel pull-up transistor 50 coupled between $V_{DD}$ and the gate terminals of the pre-charge transistors 42 and 44. Configured in this fashion, it will be evident that when READPC is high, the N-channel pre-charge driver transistor 50 will be turned on, thereby putting a high level voltage on the gates of the pre-charge transistors 42 and 44. The pre-charge transistors are thereby turned on as well.

Further, when READPC is asserted, a logic low level signal $\overline{\text{READPC}}$ is asserted to the N-channel pull-down transistor 54. This serves to apply the voltage output of the pre-charge circuit 46 to the gate terminals of the pre-charge transistors 42 and 44.

The signal level value of READPC, asserted to the N-channel pull-up transistor 50, is devised such that the pull-up transistor is operating in the linear region, and the output voltage of the pre-charge circuit is consequently less than $(V_{DD}-V_{TN})$. When this lower voltage is applied to the gate terminals of the pre-charge transistors 42 and 44, it functions to reduce the $V_{GS}$ experienced by the pre-charge transistors, thereby reducing the precharge voltage applied to the bit lines, which are charged to $[V_{DD}-2(V_{TN})]$. In the illustrated embodiment, the signal levels, device sizes, and the like, are configured to express a pre-charge voltage of 1.9 volts on the bit lines 36 and 38, even during a steady-state precharge operation, i.e., the maximum voltage to which the bit lines may be precharged is substantially reduced.

During burst read conditions, when memory cell 30 is being read at an extremely high rate, the input logic circuitry 48 defines a second signal, BURSTPC which is coupled to the gate terminal of the P-channel pre-charge driver transistor 52 coupled between $V_{DD}$ and the gate terminals of the pre-charge transistors 42 and 44, in parallel with the N-channel pre-charge driver transistor 50. The P-channel driver transistor 52 operating in this fashion, functions conventionally in combination with the N-channel pull down transistor 54 to define a quasi-inverting element. Functioning normally, the inverting element pair 52 and 54 will exhibit the voltage truncation described in connection with the prior art, above. However, in the present invention, this voltage truncation does not cause a reduction in sense amp operational range. Rather the voltage truncation maintains the pre-charge voltage top-end in approximately the same range as defined by the N-channel pull-up in the steady state condition. For example, bit lines are charged to approximately 2.0 volts.

Thus, during periods where the SRAM is not being read, the READPC signal is driven through an NFET pull up transistor 50, which reduces the $V_{GS}$ experienced by the NFET precharge transistors 42 and 44. During actual SRAM reads (i.e., during a burst read) the READPC signal is driven by a PFET. Using this methodology, the voltage range seen by the bit lines will be on the order of from about 1.9 volts to about 2.0 volts, or a variance of approximately 9% to 10%. This reduced voltage range allows sense amp design to be more efficient and provides for a simpler, higher speed implementation.

While the invention has been described in terms of CMOS integrated circuit technology, it will be evident to one having skill in the art that the invention may likewise be suitably implemented in other semiconductor technologies, such as bipolar, bi-CMOS, and the like. In addition, it should be understood that although the circuit according to the invention has been described in connection with a primarily complimentary MOS technology, the circuit may be fabricated using NMOS technology with equal facility.

Thus, the present invention, NFET/PFET RAM precharge circuitry to minimize read sense amp operational range, is disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A precharge circuit for precharging bit lines coupled to a read sense amplifier and a RAM cell, comprising:

a set of precharge transistors coupled to said bit lines for precharging said bit lines, one precharge transistor per bit line;

a first transistor being operatively coupled to turn on said set of precharge transistors when said RAM cell is not being read, said first transistor being operative to reduce the gate-to-source voltage $V_{GS}$ of said set of precharge transistors such that each of said precharge transistors output a reduced precharge voltage to the associated bit line; and a transistor pair coupled to said set of precharge transistors and being operative to switch said precharge transistors for reading said RAM cell, said RAM cell outputting a differential signal onto said bit lines when said precharge transistors are turned off, wherein said read sense amplifier monitors said bit lines to detect said differential signal on said bit lines as a data bit.

2. The precharge circuit as recited in claim 1, wherein said reduced precharge voltage on said bit lines serve to reduce the voltage range of said bit lines.

3. The precharge circuit as recited in claim 1, wherein each of said first transistor and precharge transistors is characterized by a threshold voltage $V_T$ and wherein said first transistor outputs an output voltage that is below a supply voltage $V_{DD}$ by its threshold voltage such that said reduced precharge voltage is $V_{DD}-2V_T$.

4. The precharge circuit as recited in claim 1, wherein said transistor pair is a complementary FET pair.

5. The precharge circuit as recited in 1, further comprising:

input logic circuitry coupled to said first transistor and said transistor pair, said input logic circuitry generating a first signal when said RAM cell is not to be read, wherein said input logic circuitry provides said first signal to said first transistor to reduce said precharge voltage at said bit lines.

6. The precharge circuit as recited in claim 5, wherein said input logic circuitry generates a second signal that is an inverse of said first signal, wherein said input logic circuitry provides said second signal to said transistor pair to switch off said precharge transistors.

7. The precharge circuit as recited in claim 6, wherein said input logic circuitry generates a third signal indicating a burst read mode, wherein said input logic circuitry provides said third signal to said transistor pair to switch on said precharge transistors momentarily.

8. The precharge circuit as recited in claim 1, wherein said precharge transistors, first transistor, and transistor pair are FET devices.

9. The precharge circuit as recited in claim 1, wherein said first transistor is an NFET.

10. The precharge circuit as recited in claim 1, wherein said transistor pair includes an NFET and a PFET.

11. The precharge circuit as recited in claim 7, wherein said transistor pair comprises an NFET and a PFET, wherein said input logic circuitry provides said second signal to said NFET and said third signal to said PFET.

12. The precharge circuit as recited in claim 11, wherein said second and third signals are used to read a plurality of RAM cells in said burst mode.

13. A precharge circuit for precharging a pair of bit lines coupled to a read sense amplifier and RAM cells, comprising:

a pair of precharge transistors coupled to said bit lines for precharging said bit lines;

a first transistor being operatively coupled to turn on said precharge transistors when said RAM cells are not being read, said first transistor being operative to reduce the gate-to-source voltage $V_{GS}$ of said set of precharge transistors such that each of said precharge transistors output a reduced precharge voltage to the associated bit line; and a transistor pair coupled to said pair of precharge transistors and being operative to switch said precharge transistors for reading said RAM cells, said RAM cell outputting a differential signal onto said bit lines when said precharge transistors are turned off; and input logic circuitry coupled to said first transistor and said transistor pair, said input logic circuitry generating a first signal when said RAM cells are not to be read, wherein said input logic circuitry provides said first signal to said first transistor to reduce said precharge voltage at said bit lines.

14. The precharge circuit as recited in claim 13, wherein said read sense amplifier monitors said bit lines to detect said differential signal on said bit lines as a data bit.

15. The precharge circuit as recited in claim 13, wherein said reduced precharge voltage on said bit lines effectively reduces the voltage range of said bit lines.

16. The precharge circuit as recited in claim 13, wherein each of said first transistor and precharge transistors is characterized by a threshold voltage $V_T$ and wherein said first transistor outputs an output voltage that is below a supply voltage $V_{DD}$ by its threshold voltage such that said reduced precharge voltage is $V_{DD}-2V_T$.

17. The precharge circuit as recited in claim 13, wherein said input logic circuitry generates a second signal that is an inverse of said first signal, wherein said input logic circuitry provides said second signal to said transistor pair to switch off said precharge transistors.

18. The precharge circuit as recited in claim 17, wherein said input logic circuitry generates a third signal indicating a burst read mode, wherein said input logic circuitry provides said third signal to said transistor pair to switch on said precharge transistors momentarily.

19. The precharge circuit as recited in claim 18, wherein said precharge transistors, first transistor, and transistor pair are FET devices.

20. The precharge circuit as recited in claim 13, wherein said first transistor is an NFET said transistor pair includes an NFET and a PFET.

21. The precharge circuit as recited in claim 7, wherein said transistor pair comprises an NFET and a PFET, wherein said input logic circuitry provides said second signal to said NFET and said third signal to said PFET.

22. A precharge circuit for precharging bit lines coupled to a read sense amplifier and a RAM cell, comprising:

a set of precharge transistors coupled to said bit lines for precharging said bit lines, one precharge transistor per bit line;

a first transistor being operatively coupled to turn on said set of precharge transistors when said RAM cell is not being read, said first transistor being operative to cause each of said precharge transistors to output a reduced precharge voltage to the associated bit line; and a transistor pair coupled said set of precharge transistors and being operative to switch said precharge transistors for reading said RAM cell, said RAM cell outputting a differential signal onto said bit lines when said precharge transistors are turned off, wherein said reduced precharge voltage on said bit lines serve to reduce the voltage range of said bit lines.

23. The precharge circuit as recited in claim 22, wherein said first transistor reduces the gate-to-source voltage $V_{GS}$ of said set of precharge transistors such that each of said precharge transistors outputs said reduced precharge voltages.

24. The precharge circuit as recited in claim 22, wherein said read sense amplifier monitors said bit lines to detect said differential signal on said bit lines as a data bit.

25. The precharge circuit as recited in 22, further comprising:
input logic circuitry coupled to said first transistor and said transistor pair, said input logic circuitry generating a first signal when said RAM cell is not to be read, wherein said input logic circuitry provides said first signal to said first transistor reduce said precharge voltage at said bit lines.

26. The precharge circuit as recited in claim 25, wherein said input logic circuitry generates a second signal that is an inverse of said first signal, wherein said input logic circuitry provides said second signal to said transistor pair to switch off said precharge transistors.

27. The precharge circuit as recited in claim 26, wherein said input logic circuitry generates a third signal indicating a burst read mode, wherein said input logic circuitry provides said third signal to said transistor pair to switch on said precharge transistors momentarily.

28. The precharge circuit as recited in claim 22, wherein said precharge transistors, first transistor, and transistor pair are FET devices.

29. The precharge circuit as recited in claim 22, wherein said first transistor is an NFET.

30. The precharge circuit as recited in claim 22, wherein said transistor pair includes an NFET and a PFET.

31. The precharge circuit as recited in claim 27, wherein said transistor pair comprises an NFET and a PFET, wherein said input logic circuitry provides said second signal to said NFET and said third signal to said PFET.

32. The precharge circuit as recited in claim 27, wherein said second and third signals are used to read a plurality of RAM cells in said burst mode.

* * * * *